United States Patent
Rascuná et al.

(10) Patent No.: US 12,125,933 B2
(45) Date of Patent: Oct. 22, 2024

(54) METHOD FOR MANUFACTURING A UV-RADIATION DETECTOR DEVICE BASED ON SIC, AND UV- RADIATION DETECTOR DEVICE BASED ON SIC

(71) Applicant: STMICROELECTRONICS S.r.l., Agrate Brianza (IT)

(72) Inventors: Simone Rascuná, Catania (IT); Gabriele Bellocchi, Catania (IT); Paolo Badalá, Acireale (IT); Isodiana Crupi, Catania (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 0 days.

(21) Appl. No.: 18/181,409

(22) Filed: Mar. 9, 2023

(65) Prior Publication Data

US 2023/0282757 A1 Sep. 7, 2023

Related U.S. Application Data

(62) Division of application No. 17/344,558, filed on Jun. 10, 2021, now Pat. No. 11,605,751.

(30) Foreign Application Priority Data

Jun. 23, 2020 (IT) .................... 102020000015100

(51) Int. Cl.
*H01L 31/101* (2006.01)
*H01L 31/0224* (2006.01)
(Continued)

(52) U.S. Cl.
CPC .. *H01L 31/1016* (2013.01); *H01L 31/022408* (2013.01); *H01L 31/022466* (2013.01);
(Continued)

(58) Field of Classification Search
None
See application file for complete search history.

(56) References Cited

U.S. PATENT DOCUMENTS 8,962,468 B1   2/2015   Hostetler
2005/0104072 A1   5/2005   Slater et al.
(Continued)

FOREIGN PATENT DOCUMENTS

CN   109037041 A   12/2018
CN   109326657 A   2/2019
(Continued)

OTHER PUBLICATIONS

Badala, P. et al., "Ni/4H-SiC interaction and silicide formation under excimer laser annealing for ohmic contact," *Materialia 9 100528*, 2020, 6 pages.
(Continued)

*Primary Examiner* — Suberr L Chi
(74) *Attorney, Agent, or Firm* — Seed IP Law Group LLP

(57) ABSTRACT

A device for detecting UV radiation, comprising: a SiC substrate having an N doping; a SiC drift layer having an N doping, which extends over the substrate; a cathode terminal; and an anode terminal. The anode terminal comprises: a doped anode region having a P doping, which extends in the drift layer; and an ohmic-contact region including one or more carbon-rich layers, in particular graphene and/or graphite layers, which extends in the doped anode region. The ohmic-contact region is transparent to the UV radiation to be detected.

18 Claims, 4 Drawing Sheets

(51) Int. Cl.
*H01L 31/103* (2006.01)
*H01L 31/18* (2006.01)

(52) U.S. Cl.
CPC ........ *H01L 31/103* (2013.01); *H01L 31/1812* (2013.01); *H01L 31/1864* (2013.01); *H01L 31/1884* (2013.01)

(56) References Cited

U.S. PATENT DOCUMENTS

| | | | |
|---|---|---|---|
| 2006/0192256 | A1 | 8/2006 | Cooper et al. |
| 2007/0066039 | A1 | 3/2007 | Agarwal et al. |
| 2008/0099769 | A1 | 5/2008 | Rupp et al. |
| 2009/0289262 | A1 | 11/2009 | Zhang et al. |
| 2011/0266558 | A1 | 11/2011 | Yano |
| 2013/0020585 | A1 | 1/2013 | Ishibashi |
| 2013/0062620 | A1 | 3/2013 | Henning et al. |
| 2013/0313573 | A1 | 11/2013 | Mizukami et al. |
| 2015/0091022 | A1 | 4/2015 | Kawaguchi et al. |
| 2015/0214164 | A1 | 7/2015 | Matocha et al. |
| 2015/0372093 | A1 | 12/2015 | Saggio et al. |
| 2017/0077087 | A1 | 3/2017 | Horikawa et al. |
| 2017/0170280 | A1 | 6/2017 | Wakabayshi et al. |
| 2017/0309720 | A1* | 10/2017 | Joshi ................ H01L 29/45 |
| 2018/0019309 | A1 | 1/2018 | Radhakrishnan et al. |
| 2018/0097103 | A1 | 4/2018 | Sadamatsu et al. |
| 2018/0175153 | A1 | 6/2018 | Schulze et al. |
| 2018/0190651 | A1 | 7/2018 | Siemieniec et al. |
| 2019/0081170 | A1 | 3/2019 | Kumagai |
| 2020/0044031 | A1 | 2/2020 | Pham et al. |
| 2020/0258996 | A1 | 8/2020 | Ohse |
| 2020/0303564 | A1 | 9/2020 | Rascuna' et al. |
| 2021/0280424 | A1 | 9/2021 | Rascuna' et al. |
| 2021/0328022 | A1 | 10/2021 | Rascuná et al. |
| 2021/0328023 | A1 | 10/2021 | Rascuná et al. |
| 2021/0399154 | A1 | 12/2021 | Rascuná et al. |
| 2023/0343831 | A1 | 10/2023 | Rascuna' et al. |
| 2023/0411158 | A1 | 12/2023 | Rascuna' et al. |

FOREIGN PATENT DOCUMENTS

| | | |
|---|---|---|
| JP | 2011071281 A | 4/2011 |
| JP | 2014063948 A | 4/2014 |
| JP | 2015153789 A | 8/2015 |

OTHER PUBLICATIONS

Kusdemir, E. et al., "Epitaxial graphene contact electrode for silicon carbide based ultraviolet photodetector," *Journal of Phys. D: Appl. Phys.* vol. 48, 2015, p. 1-6.

Lebedev, A. et al., "Low temperature transport properties of multigraphene structures on 6H-SiC obtained by thermal graphitization: evidences of a presence of nearly perfect graphene layer," *Cornell University* URL=https://arxiv.org/abs/1212.4272, downloaded on Dec. 18, 2012, 8 pages.

Lemaitre, M. et al., "Low-temperature, site selective graphitization of SiC via ion implantation and pulsed laser annealing," *Applied Physics Letters*, vol. 100, May 8, 2012, p. 193105-1-193105-4.

Lioliou, G. et al., "Electrical and ultraviolet characterization of 4H-SiC Schottky photodiodes," *Optics Express 21657*, vol. 23, No. 17, 2015, 14 pages.

Liu et al., "Visible blind p+/p/n-/n+ UV 4H-SiC photodiodes based on 4H-SiC homeopilayers," *2006 8th International Conference on Solid-State and Integrated Circuit Technology Proceedings*, Oct. 2006, pp. 866-868.

Liu, F. et al., "Enhanced Ohmic contact via graphitization of polycrystalline silicon carbide," *Applied Physics Letters*, vol. 97, 2010, p. 262107-1-262107-3.

Lu, W. et al., "Catalytic graphitization and Ohmic contact formation on 4H-SiC," *Journal of Applied Physics*, vol. 93, No. 9, May 1, 2003 p. 5397-5403.

Mazzamuto, F. et al., "Low thermal budget ohmic contact formation by laser anneal," *Materials Sciemnce Forum*, vol. 858, 2016, 4 pages.

Rascuna, S. et al., "Morphological and electrical properties of Nickel based Ohmic contacts formed by laser annealing process on n-type 4H-SiC," *Manuscript submitted to Materials Science in Semiconductor Processing*, Nov. 20, 2018, 7 pages.

* cited by examiner

METHOD FOR MANUFACTURING A UV-RADIATION DETECTOR DEVICE BASED ON SIC, AND UV- RADIATION DETECTOR DEVICE BASED ON SIC

BACKGROUND

Technical Field

The present disclosure relates to a method for manufacturing a UV-radiation detector device and to a UV-radiation detector device. In particular, the present disclosure relates to a photodetector diode with anode terminal or cathode terminal that are transparent to the UV radiation to be detected.

Description of the Related Art

As is known, semiconductor materials that have a wide bandgap, in particular, an energy value Eg of the bandgap higher than 1.1 eV, low on-state resistance ($R_{ON}$), a high value of thermal conductivity, high operating frequency and high speed of saturation of the charge carriers are ideal for producing electronic components, such as diodes or transistors, in particular for power applications. A material having these characteristics, and designed for being used for manufacturing electronic components, is silicon carbide (SiC). In particular, silicon carbide, in its different polytypes (for example, 3C—SiC, 4H—SiC, 6H—SiC), is preferable to silicon as regards the properties listed previously.

Electronic devices provided on a silicon-carbide substrate, as compared to similar devices provided on a silicon substrate, present numerous advantages, such as low output on-state resistance, low leakage current, high operating temperature and high operating frequencies. In particular, detection of ultraviolet (UV) radiation, for example coming from the Sun, from astronomic objects, or from artificial sources (in the medical, military, environmental, and astronomical fields) has received a considerable attention in the last few years. The manufacture of arrays of high-sensitivity diodes therefore present particular interest. In this context, wide-band-gap materials are excellent candidates for the detection of UV radiation; silicon carbide is consequently particularly suited for the purpose. Among SiC polytypes, 4H—SiC is preferable for detecting UV radiation, thanks to its wide band gap (approximately 3.3 eV).

Schottky or PN photodiodes of a known type, for detection of UV radiation, are manufactured on a 4H—SiC epitaxial layer grown on a heavily doped substrate. Schottky contacts are provided on the front of the photodiode by formation of metal regions that provide the Schottky contacts, while an ohmic contact is provided on the back of the photodiode, for example by formation of a nickel layer followed by a fast thermal annealing (at approximately 950-1000° C.). The Schottky contacts on the front side are obtained by defining, by lithographic processes, structures of titanium or nickel-silicide that are typically comb-fingered. The geometry of Schottky contacts on the front side (front electrode) is chosen so as to enable direct exposure to the radiation to be detected and vertical-conduction electrical operation of the Schottky photodiode thus manufactured.

The area of the single diode directly exposed to UV radiation and electro-optically active is limited by the presence of the front Schottky contacts, which reflect and/or absorb the UV radiation and therefore reduce the useful area effectively exposed.

FIG. 1 shows, in side cross-sectional view in a (triaxial) cartesian reference system of axes X, Y, Z, a vertical-conduction Schottky diode 1 of a known type.

The Schottky diode 1 includes: a substrate 3 of heavily doped SiC of a N type (e.g., $1 \cdot 10^{20}$ atoms/cm$^3$), provided with a surface 3a opposite to a surface 3b; a drift layer 2 of SiC grown epitaxially on the surface 3a of the substrate 3, having a dopant concentration of an N type lower than the dopant concentration of the substrate 3; an ohmic-contact region 6 (for example of nickel silicide), which extends over the surface 3b of the substrate 3; a cathode metallization 16, which extends over the ohmic-contact region 6; and an anode metallization 8, which extends over a top surface 2a of the drift layer 2.

Schottky contacts or junctions (of a semiconductor-metal type) are consequently formed at the interface between the drift layer 2 and the anode metallization 8. In particular, Schottky junctions are formed by portions of the drift layer 2 in direct electrical contact with respective portions of the anode metallization 8.

As has been said, a disadvantage of this device is the reduction of the active area, i.e., of the area dedicated to generation of charge carriers following upon interaction with the UV radiation to be detected. In fact, the portions of the surface 2a coated by the anode metallization 8 do not participate in the detection of the UV radiation and subsequent generation of the charge carriers on account of absorption and/or reflection of the UV radiation itself to be detected by the anode metallization 8.

BRIEF SUMMARY

The present disclosure is to provide a method for manufacturing a UV-radiation detector device, as well as a UV-radiation detector device that will be able to overcome the drawbacks of the prior art.

According to the present disclosure a method for manufacturing a UV-radiation detector device and a UV-radiation detector device are provided. The present disclosure includes a method of manufacturing a detector device for detecting UV radiation by: forming, on a front side of a silicon carbide (SiC) substrate that has a first conductivity and a first concentration of dopant species, a drift layer of SiC having the first conductivity and a second concentration of dopant species lower than the first concentration; forming, on a back side of the substrate, a cathode terminal of the detector device; and forming, in the drift layer, an anode terminal of the detector device. The forming the anode terminal includes forming a doped anode region by implanting, in the drift layer, dopant species having a second conductivity opposite to the first conductivity and forming a first ohmic-contact region including one or more carbon-rich layers in said doped anode region with a laser.

The present disclosure also includes a device having a silicon carbide substrate having a first dopant type with a first dopant concentration, the silicon carbide substrate including a first surface opposite to a second surface; a drift layer on the first surface of the silicon carbide substrate, the drift layer having the first dopant type, the drift layer having a first surface spaced from the first surface of the silicon carbide substrate; an anode having a second dopant type in the drift layer between the first surface of the drift layer and the first surface of the silicon carbide substrate; and a first ohmic-contact in the anode between the first surface of the drift layer and the first surface of the silicon carbide substrate, the first ohmic-contact including carbon.

BRIEF DESCRIPTION OF THE SEVERAL VIEWS OF THE DRAWINGS

For a better understanding of the present disclosure, preferred embodiments thereof are now described purely to way of non-limiting example with reference to the attached drawings, wherein.

DETAILED DESCRIPTION

Figure 1:
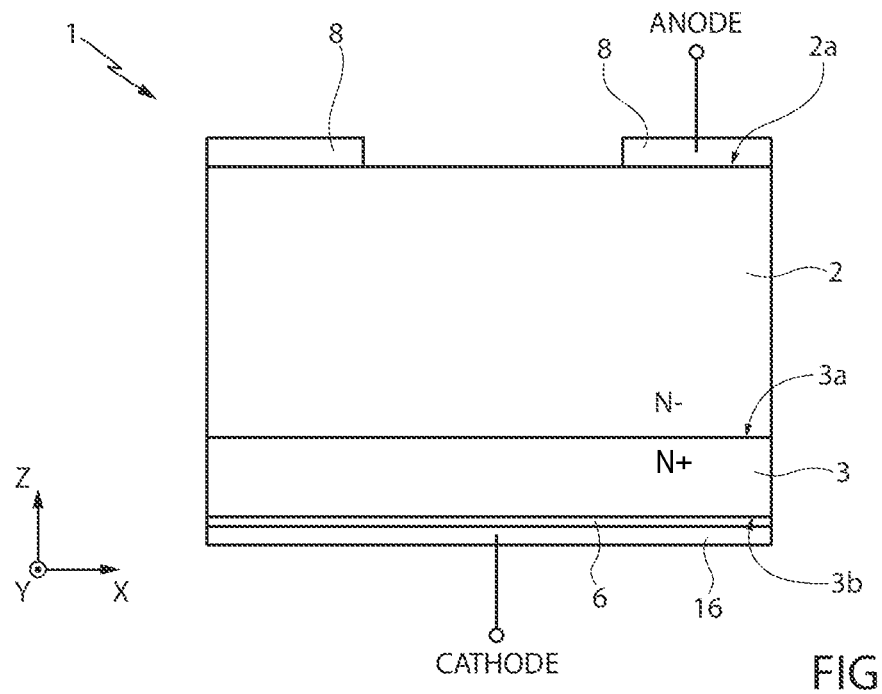
FIG. 1 is a cross-sectional view of a Schottky photodiode according to a known embodiment.
Figure 2:
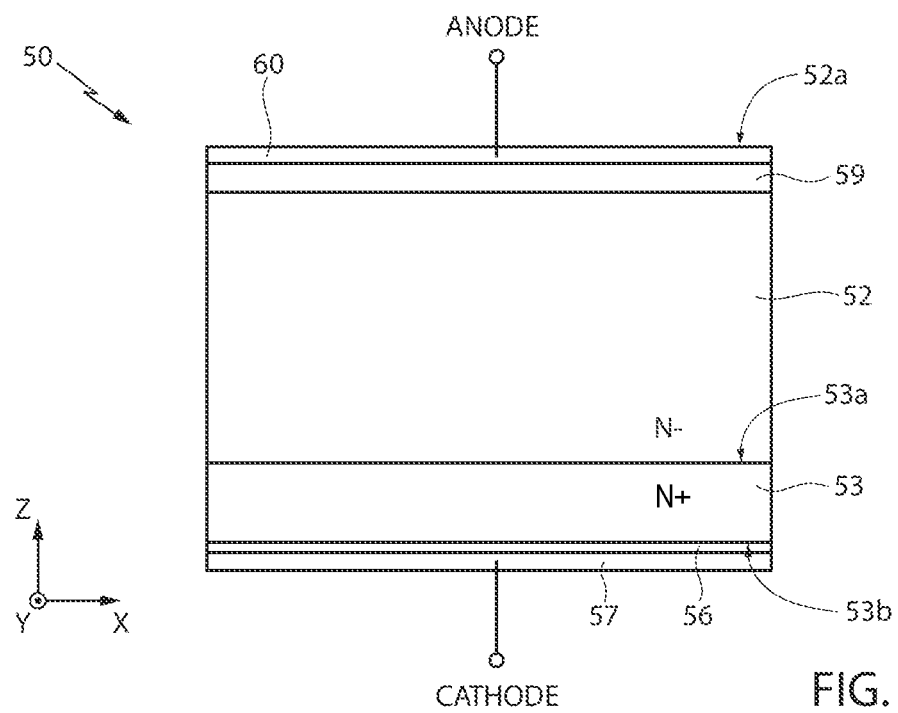
FIG. 2 is a cross-sectional view of a UV-radiation detector device according to one embodiment of the present disclosure.

FIG. 2 shows, in side cross-sectional view in a (triaxial) cartesian reference system of axes X, Y, Z, a device 50, in particular a device for detecting ultraviolet radiation (UV), in particular a PN diode, according to one aspect of the present disclosure. In this context, the device 50 is designed to detect radiation having a wavelength in the 200-nm to 380-nm range.

The device 50 includes: a substrate 53, of SiC of an N type, having a first dopant concentration, provided with a surface 53a opposite to a surface 53b, and having a thickness comprised between 50 µm and 350 µm, for example substantially equal to 180 µm; a drift layer (e.g., grown epitaxially) 52, of SiC of an N type, having a second dopant concentration lower than the first dopant concentration, which extends over the surface 53a of the substrate 53 and has a thickness comprised, for example, between 5 and 100 inn; an ohmic-contact region or layer 56 (for example, of nickel silicide), which extends over the surface 53b of the substrate 53; a cathode metallization 57, for example of Ti/NiV/Ag or Ti/NiV/Au, which extends over the ohmic-contact region 56; an implanted anode region 59, which extends in the drift layer 52, facing the top surface 52a of the drift layer 52, of a P type; and an ohmic-contact layer 60, which extends in the implanted anode region 59 and faces the top surface 52a of the drift layer 52.

The doping level of the substrate 53 is, for example, comprised between $1 \cdot 10^{19}$ and $1 \cdot 10^{22}$ atoms/cm$^3$; the doping level of the drift layer 52 is, for example, comprised between $1 \cdot 10^{13}$ and $5 \cdot 10^{16}$ atoms/cm$^3$; the doping level of the implanted anode region 59 is, for example, equal to or higher than to $1 \cdot 10^{18}$ atoms/cm$^3$.

According to one aspect of the present disclosure, the ohmic-contact layer 60 includes one or more carbon-rich layers, which comprise, for example, graphite layers, or graphene multi-layers. More in particular, the ohmic-contact layer 60 has, on the surface 52a, an SiC amorphous layer in which the carbon atoms are preponderant (for example, at least twice as many, in particular from twice to 100 times as many) as compared to the silicon atoms, following upon a separation of phase between the silicon atoms and the carbon atoms of the SiC substrate. Underneath this amorphous layer, the ohmic-contact layer 60 may present a layer including carbon clusters (e.g., graphite layer), having a thickness greater than that of the amorphous layer. Formation of this ohmic-contact layer 60 is due to a thermal decomposition of silicon carbide, as a result of the manufacturing process illustrated in what follows.

According to a further aspect of the present disclosure, the ohmic-contact layer 60 is self-aligned, on the surface 52a, with the implanted region 59 (i.e., in top view in the plane XY, the ohmic-contact layer 60 has the same shape and extension as the implanted region 59).

In addition, according to a further aspect of the present disclosure, the ohmic-contact layer 60 does not extend, along Z, beyond the surface 52a; in other words, the ohmic-contact layer 60 has a top surface 60a coplanar (i.e., aligned along X) with the surface 52a, and extends in depth (along Z) in the implanted region 59 for a depth comprised between one nanometer and some tens of nanometers (e.g., between 1 and 20 nm) measured starting from the surface 52a.

The shape in plan view, or "layout", of the implanted region 59 (and therefore of the ohmic-contact layer 60) in the plane XY can be chosen according to the need, in the design stage. In particular, the implanted region 59 can extend continuously (in top view in the plane XY) over the entire active area of the device 50, or else only over a portion of the active area of the device 50, or else may be formed by a plurality of implanted sub-regions separated from one another by portions of the drift layer 52.

The present applicant has found that an ohmic-contact layer 60 of the type described previously is transparent to UV radiation, in particular to radiation with a wavelength in the 200-nm to 380-nm range. Therefore, in use, even in the case where the ohmic-contact layer 60 were to cover the entire active area of the device 50, the UV radiation to be detected would traverse in any case the ohmic-contact layer 60, reaching the drift layer 52 and generating, in a per se known manner, the charge carriers. By appropriately polarizing the device 50 between the anode and the cathode (e.g., by bonding wires) it is thus possible to collect and measure a current induced by the UV radiation, in a way in itself known that does not form part of the present disclosure.

Steps of formation of the device 50 are described in what follows, only with reference to the steps of formation of the ohmic-contact layer 60 (the remaining steps are carried out according to the prior art).

Figure 3:
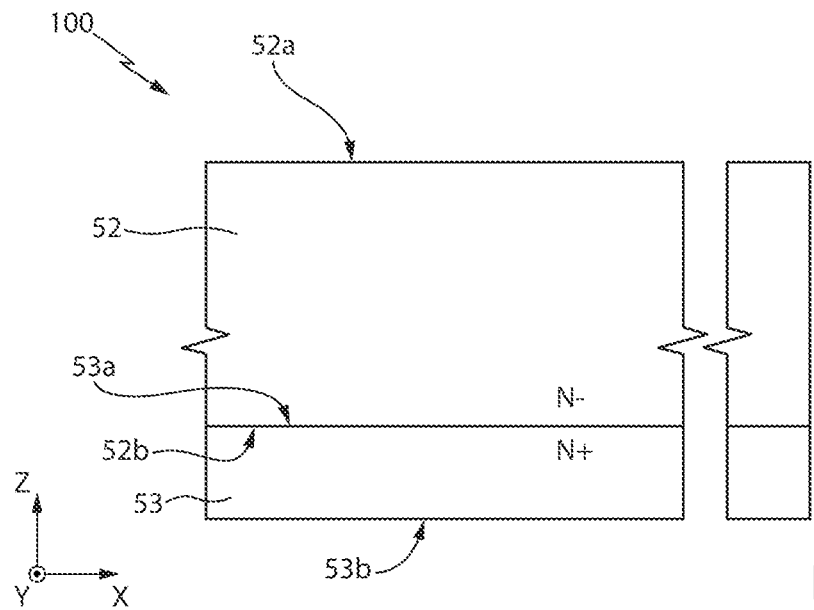
FIGS. 3-5 show steps for manufacturing the device of FIG. 2, according to one embodiment of the present disclosure.

With reference to FIG. 3, a wafer 100 is arranged, including the substrate 53 of SiC (in particular, 4H—SiC; however, other polytypes may be used such as, though not exclusively, 2H—SiC, 3C—SiC and 6H—SiC).

As has been said, the substrate 53 has a first conductivity type (in this embodiment a doping of an N type) and is provided with the front surface 53a and the back surface 53b, which are opposite to one another along the axis Z. The substrate 53 has a dopant concentration comprised between $1 \cdot 10^{19}$ and $1 \cdot 10^{22}$ atoms/cm$^3$.

The front of the wafer 100 corresponds to the front surface 53a, and the back of the wafer 100 corresponds to the back surface 53b. The resistivity of the substrate 30 is, for example, comprised between 2 mΩ·cm and 40 mΩ·cm.

Formed on the front surface 53a of the substrate 53, for example by epitaxial growth, is the drift layer 52 of silicon carbide having the first conductivity type (N) and having a dopant concentration lower than that of the substrate 53, for example comprised between $1 \cdot 10^{13}$ and $5 \cdot 10^{16}$ atoms/cm$^3$.

The drift layer 52 is of SiC, in particular 4H—SiC, but it is possible to use other SiC polytypes, such as 2H, 6H, 3C or 15R.

The drift layer 52 has a thickness defined between a top side 52a and a bottom side 52b (the latter being in direct contact with the front surface 53a of the substrate 53).

Then (FIG. 4), an implantation is performed of dopant species (for example, boron or aluminum), which have the second conductivity type (here, a P conductivity). The implantation (indicated in the figures by arrows 72) can be carried out with or without implantation mask, according to the design requirements, as mentioned previously. In the absence of an implantation mask, an implanted region extends throughout the extension of the plane XY of a cartesian reference system, as indicated in the figures, of the drift layer 52 and along Z for a depth that depends upon the energy of the implantation itself; in the presence of implantation mask, one or more implanted regions extend where the implantation mask is transparent to the implantation.

Figure 4:
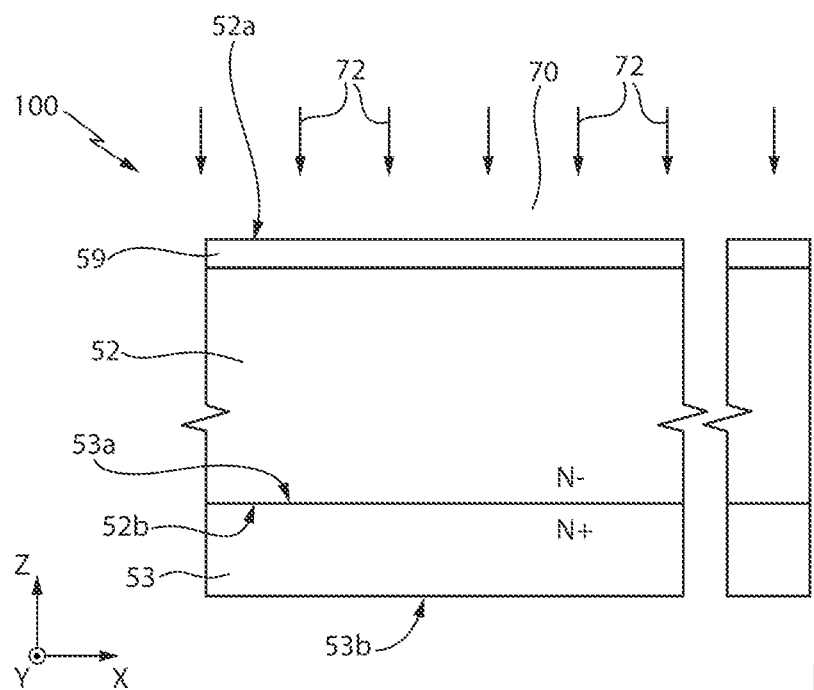

In an embodiment provided by way of example, the implantation step of FIG. 4 comprises one or more implantations of dopant species, which have the second conductivity type, with implantation energy comprised between 30 keV and 500 keV, and with doses of between $1 \cdot 10^{12}$ atoms/$cm^2$ and $1 \cdot 10^{15}$ atoms/$cm^2$. A subsequent thermal annealing enables activation of the dopants thus implanted and form the implanted anode region 59 with a dopant concentration of higher than $1 \cdot 10^{18}$ atoms/$cm^3$ and depth, measured starting from the surface 52a, comprised between 0.3 μm and 1 μm.

Figure 5:
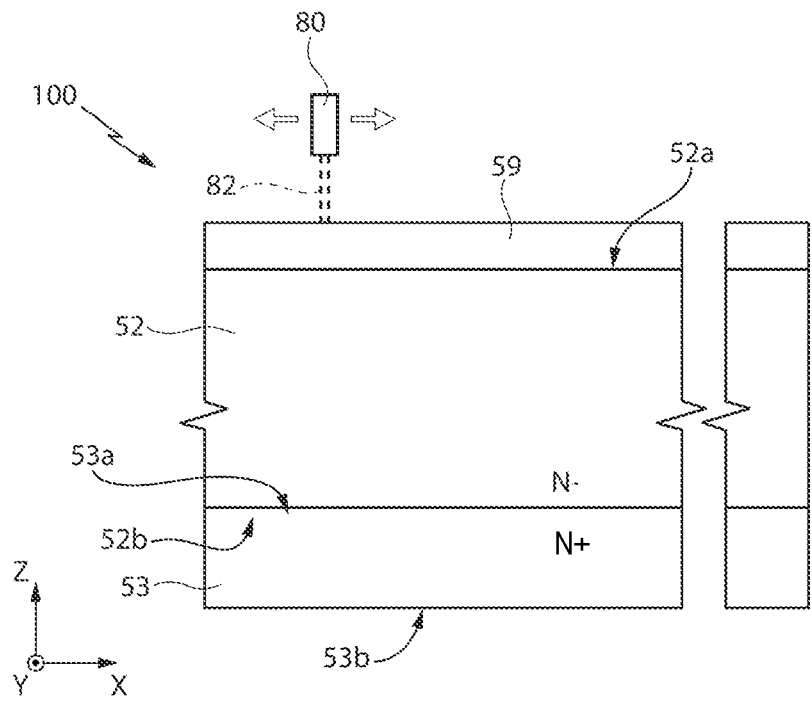

Next (FIG. 5), generated on the surface 52a is a thermal budget designed to favor generation, in the implanted region 59, of the aforementioned one or more carbon-rich layers (for example, graphene and/or graphite layers).

For this purpose, a laser source 80 is used, configured to generate an appropriate beam 82.

The laser 80 is, for example, a UV excimer laser. Other types of laser may be used, amongst which lasers with a wavelength in the region of the visible.

The configuration and operating parameters of the laser 80, optimized for achieving the purpose of the present disclosure, i.e., for enabling formation of an ohmic contact in the implanted region 59, are the following:

- wavelength: between 290 and 370 nm, in particular 310 nm;
- pulse duration: between 100 ns and 300 ns, in particular 160 ns;
- number of pulses (scans): between 1 and 5;
- energy density: between 1.5 J/$cm^2$ and 4 J/$cm^2$, in particular 3 J/$cm^2$ (considered at the level of the surface 52a); and
- temperature: between 1400° C. and 2600° C., in particular 1800° C. (considered at the level of the surface 52a).

The area of the spot of the beam 82 at the level of the surface 52a is, for example, comprised between 0.7 and 1.5 $cm^2$.

In order to cover the entire wafer 100, or the sub-region of the wafer 100 to be heated, one or more scans of the laser 80 are therefore performed in the plane XY (e.g., a plurality of scans parallel to one another and to the axis X and/or axis Y).

Given the depth of the implanted region 59, a temperature of approximately 2000° C. at the level of the surface 52a is sufficient to guarantee temperatures within the range identified above also at the maximum depth reached by the implanted region 59 (e.g., 1 μm) so as to guarantee activation of all the dopant without the need to carry out a dedicated thermal budget.

This temperature is such as to favor generation of compounds of the carbon-rich ohmic contacts exclusively in the implanted region 59, and not at the surface 52a without the implanted region 59. This effect, of a type in itself known, is described, for example, by Maxime G. Lemaitre, "Low-temperature, site selective graphitization of SiC via ion implantation and pulsed laser annealing", APPLIED PHYSICS LETTERS 100, 193105 (2012).

In one embodiment, transformation of part of the implanted region 59 into the ohmic-contact layer 60 is obtained by heating the entire wafer 100, appropriately moving the laser 80. With an energy density of the beam 82 comprised between 1.5 and 3 J/$cm^2$, the localized and surface increase of the temperature causes formation of the ohmic-contact layer 60. Where the implanted region 59 is not present, this effect is not observed.

In a different embodiment, transformation of the surface portion of the implanted region 59 into the ohmic-contact layer 60 is obtained by treating only a part of the wafer 100, which might not correspond to the entire extension of the implanted region 59 (for example, excluding possible portions that are not of interest during use of the device 50 as UV detector in so far as they do not take part in generation and transport of electric charge).

In a further embodiment, it is possible to arrange on the surface 52a (either in contact with the surface 52a or at a distance therefrom) a mask having one or more regions transparent to the beam 82 (i.e., the beam 82 traverses them) and regions opaque to the beam 82 (i.e., the beam 82 does not traverse them, or traverses them in attenuated form such as not to heat significantly the portions of the wafer 100 that extend underneath it). The transparent regions of the mask that are aligned to the implanted region 59 (or to respective implanted regions) enable formation of the respective ohmic-contact layer 60. Possible regions of the drift layer 52 without the P implantation are covered and protected by the mask. In this case, the energy density of the beam 82 can be increased up to 4.5 J/$cm^2$ or more. In fact, to generate an ohmic contact in doped regions during epitaxial growth, an energy density of the laser beam is required higher than the one required for generation of an ohmic contact in doped regions through the ion-implantation process (in particular, higher than approximately 3 J/$cm^2$).

In this embodiment, since a mask is present that exposes only the implanted regions 59, it is possible to use energy densities of higher than 3 J/$cm^2$, without the risk of forming an ohmic contact on regions of an N type of the drift layer 52.

The step of thermal annealing for activation of the dopants of the implanted region 59 may, in one embodiment, coincide with the step of formation of the ohmic-contact layer 60 in so far as the temperature reached by the laser beam 82 is such as to activate the dopants. Alternatively, it is in any case possible to carry out traditional thermal annealing prior to formation of the ohmic-contact layer 60.

Transformation of the SiC of a P type into the ohmic contact occurs at temperatures comprised between 1200° C. and 2600° C., more in particular temperatures higher than of 1600° C. These temperatures are reached in a surface portion (some nanometers, e.g., 1-20 nm) of the implanted region 59.

For greater depths, the temperature drops to values such as not to cause any longer transformation of silicon carbide into carbon-rich layers (graphene and/or graphite layers).

Formation of the ohmic contact is therefore self-limited. Consequently, the ohmic-contact layer 60 does not extend throughout the thickness of the respective implanted region, but exclusively at the surface level thereof. The ohmic-contact layer 60 is formed within the implanted region 59 such that a top surface of the implanted region 59 is coplanar or otherwise coinciding with a top surface of the ohmic-contact layer 60.

Figure 6:
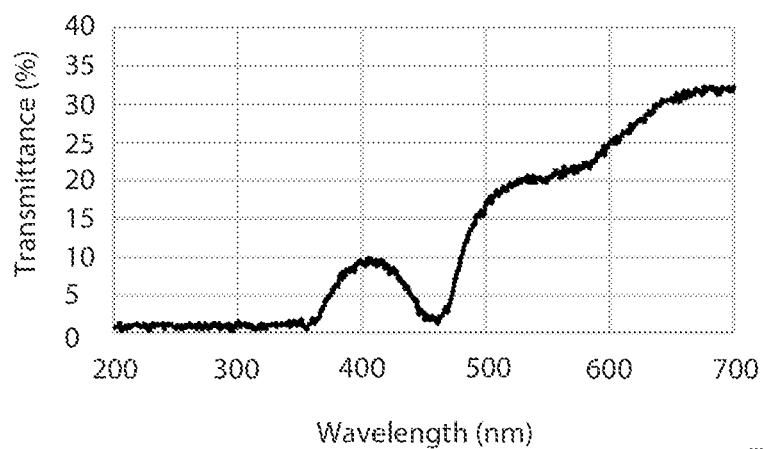
FIG. 6 illustrates measurements of transmittance of the device manufactured according to the present disclosure.

The present applicant has found that, with the parameters of laser configuration and operation identified previously, the desired electrical and optical behavior for the device 50 is obtained. FIG. 6 illustrates, in this regard, experimental data of transmittance after formation of the ohmic-contact layer 60 and exposure of the device 50 to UV radiation at various wavelengths; the behavior is as expected and is comparable with that of a traditional UV detector.

Figure 7:
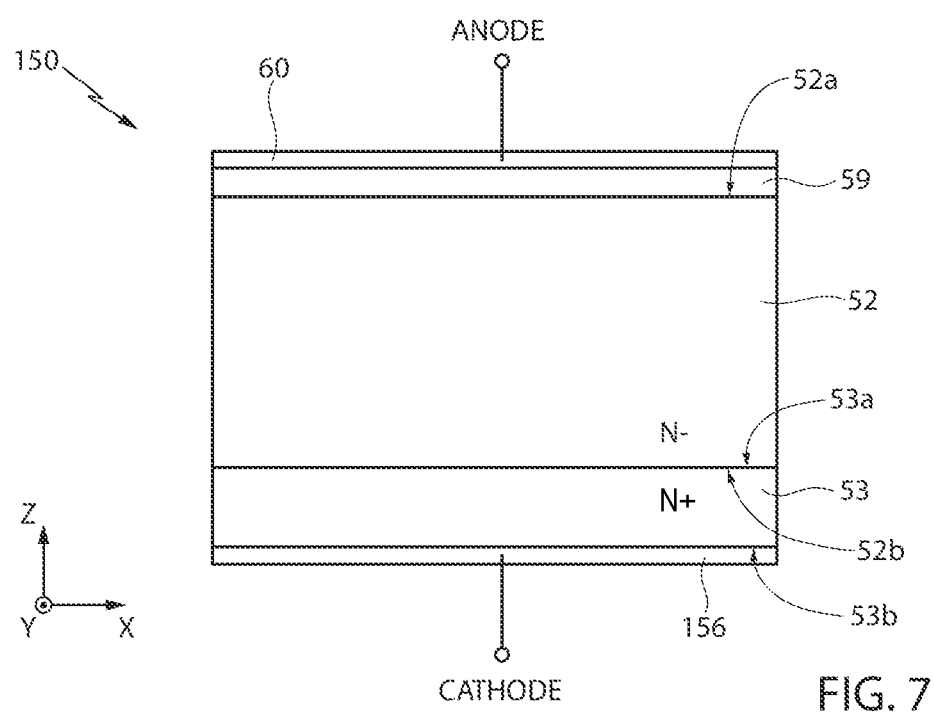
FIG. 7 is a cross-sectional view of a UV-radiation detector device according to a further embodiment of the present disclosure.

FIG. 7 illustrates a UV detector device 150 according to a further aspect of the present disclosure.

Elements of the device 150 common to the device 50 of FIG. 2 are designated by the same reference numbers and are not described any further.

Unlike the device 50, the device 150 does not have the ohmic-contact layer 56 of nickel silicide and the cathode metallization 57. Instead, the device 150 includes an ohmic-contact layer 156, which extends over the surface 53b of the substrate 53. The ohmic-contact layer 156 is similar to the ohmic-contact layer 60 (in particular, it can include one or more carbon-rich layers, for example graphite layers or graphene multi-layers) and is transparent to the UV radiation to be detected (e.g., with a wavelength in the range from 200 nm to 380 nm).

Formation of the ohmic-contact layer 156 includes a laser treatment (similar to what has been discussed previously for formation of the ohmic-contact layer 60).

Optimization of the ohmic properties of the contact 156 at the back of the substrate 53 (having an N doping) requires an energy density of the beam 82 different from the energy required for optimization of the ohmic properties of the layer 60 in the implanted region (having a P doping). In fact, as has been said, to generate an ohmic contact on the substrate having an N doping an energy density of the laser beam is required greater than that required for generation of an ohmic contact in a doped region P via the implantation process. For this purpose, it is possible to regulate operating parameters of the laser 80 to generate beams with different characteristics according to the ohmic-contact layer 60 or 156 that it is desired to form, each beam being designed for generating the respective layer with ohmic properties.

It is consequently also possible to use the laser 80, with the following configuration and operating parameters, to form the ohmic contact 156 at the back 53b of the substrate 53, namely:

wavelength: between 290 and 370 nm, in particular 310 nm;
pulse duration: between 100 ns and 300 ns, in particular 160 ns;
number of pulses (scans): between 1 and 5;
energy density: between 3 and 4.5 J/cm$^2$, in particular between 3.2 J/cm$^2$ and 4.5 J/cm$^2$; and
temperature: between 1400° C. and 2600° C., in particular higher than 1800° C. (considered at the level of the surface 53b).

In this way a UV detector is obtained capable of receiving the UV radiation from both sides (front and back).

From an examination of the characteristics of the disclosure provided according to the present disclosure the advantages that it affords are evident.

In particular, the response of the detector is maximized thanks to the possibility of exploiting, by photodetection, all the surface available irrespective of the presence of the electrical contacts (which, according to the disclosure, as has been said, are transparent to the UV radiation to be detected).

In addition, the manufacturing process flow is simplified as compared to the prior art.

Moreover, the present disclosure makes it possible to provide a UV detector designed to detect radiation that impinges upon both surfaces (front and back), which can be used, for example, to manufacture windows of space stations and/or buildings, spectacles, etc.

Furthermore, according to the present disclosure, the possibility is provided of modulating the shape and dimensions of the area that detects the UV radiation by directing the laser beam according to the need, i.e., without the use of photomasking techniques.

Finally, it is clear that modifications and variations may be made to what has been described and illustrated herein, without with thereby departing from the scope of the present disclosure, as defined in the annexed claims.

A method for manufacturing a detector device (50; 150) for detecting UV radiation, may be summarized as including the steps of providing a SiC substrate (53) having a first conductivity (N) and a first concentration of dopant species, provided with a front side (53a) and a back side (53b) opposite to one another; forming, on the front side (53a) of the substrate (53), a drift layer (52) of SiC having the first conductivity (N) and a second concentration of dopant species lower than the first concentration; forming, on the back side of the substrate (53), a cathode terminal of said detector device (50); and forming, in the drift layer (52), an anode terminal of said detector device (50; 150), characterized in that the step of forming the anode terminal comprises implanting, in the drift layer (52), dopant species having a second conductivity (P) opposite to the first conductivity (N), thus forming a doped anode region (59); and generating a first laser beam (82) towards said doped anode region (59) to cause heating of the doped anode region (59) to temperatures comprised between 1500° C. and 2600° C., so as to form a first ohmic-contact region (60) including one or more carbon-rich layers, in particular layers of graphene and/or graphite, in said doped anode region (59).

The doped anode region (59) may extend in depth in the drift layer (52) starting from a top surface (52a) of the drift layer (52), and wherein said first ohmic-contact region (60) has a top surface thereof coinciding with said top surface (52a) of the drift layer (52).

Heating of the doped anode region (59) by the first laser beam (82) may cause activation of the dopant species having the second conductivity (P) of the doped anode region (59).

Said first laser beam (82) may be generated according to the following parameters: wavelength between 290 nm and 370 nm; pulse duration between 100 and 300 ns; and energy density between 1.5 and 4.5 J/cm2.

Forming the first ohmic-contact region (60) may include forming said one or more carbon-rich layers exclusively within the doped anode region (59).

Said first ohmic-contact region (60) may extend in the doped anode region (59) for a depth comprised between 1 nm and 20 nm.

The step of forming the cathode terminal may include generating a second laser beam towards the back side (53b) of the substrate (53) in order to cause heating of the substrate (53) to temperatures between 1500° C. and 2600° C., so as to form a second ohmic-contact region (156) including one or more carbon-rich layers, in particular layers of graphene and/or graphite, on said back side (53b) of the substrate (53).

Said second laser beam may be generated according to the following parameters wavelength: between 290 nm and 370 nm; pulse duration between 100 and 300 ns; and energy density between 3 and 4.5 J/cm2.

A detector device (50; 150) for detecting UV radiation may be summarized as including a SiC substrate (53) having a first conductivity (N) and a first concentration of dopant species, provided with a front side (53a) and a back side (53b) opposite to one another; a SiC drift layer (52), which extends over the front side (53a) of the substrate (53), having the first conductivity (N) and a second concentration of dopant species lower than the first concentration; a cathode terminal on the back side of the substrate (53); and an anode terminal in the drift layer (52), characterized in that the anode terminal comprises a doped anode region (59) in the drift layer (52), including dopant species having a second conductivity (P) opposite to the first conductivity (N); a first ohmic-contact region (60) including one or more carbon-rich layers, in particular graphene and/or graphite layers, which extends in said doped anode region (59).

The doped anode region (59) may extend in depth in the drift layer (52) starting from a top surface (52a) of the drift layer (52), and wherein said first ohmic-contact region (60) has a top surface thereof coinciding with said top surface (52a) of the drift layer (52).

The first ohmic-contact region (60) may include said one or more carbon-rich layers exclusively within the doped anode region (59).

Said first ohmic-contact region (60) may extend in the doped anode region (59) for a depth comprised between 1 nm and 20 nm.

Said substrate (53) may be of 4H—SiC.

The cathode terminal may include a second ohmic-contact region (156) including one or more carbon-rich layers, in particular graphene and/or graphite layers, which extends in said doped anode region (59).

The second ohmic-contact region (156) may have a surface thereof coinciding with the back side (53b) of the substrate (53).

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
 manufacturing a detector device for detecting UV radiation by:
  forming, on a front side of a silicon carbide (SiC) substrate that has a first conductivity and a first concentration of dopant species, a drift layer of SiC having the first conductivity and a second concentration of dopant species lower than the first concentration;
  forming, on a back side of the substrate, a cathode terminal of the detector device; and
  forming, in the drift layer, an anode terminal of the detector device, the forming the anode terminal includes:
   forming a doped anode region by implanting, in the drift layer, dopant species having a second conductivity opposite to the first conductivity; and
   forming a first ohmic-contact region including one or more carbon-rich layers in said doped anode region with a laser.

2. The method according to claim 1, wherein the doped anode region extends in depth in the drift layer starting from a top surface of the drift layer,
 and the first ohmic-contact region has a top surface coinciding with the top surface of the drift layer.

3. The method according to claim 1, wherein forming the first ohmic-contact region includes heating of the doped anode region to temperatures in the range of 1500° ° C. and 2600° C. by generating a first laser beam with the laser towards the doped anode region and causing activation of the dopant species having the second conductivity of the doped anode region.

4. The method according to claim 3, wherein generating the first laser beam includes:
 utilizing a wavelength in the range of 290 nm and 370 nm;
 utilizing a pulse duration in the range of 100 and 300 ns; and
 utilizing an energy density in the range of 1.5 and 4.5 J/cm$^2$.

5. The method according to claim 1, wherein forming the first ohmic-contact region comprises forming the one or more carbon-rich layers exclusively within the doped anode region.

6. The method according to claim 1, wherein the first ohmic-contact region extends in the doped anode region for a depth in the range of 1 nm and 20 nm.

7. The method according to claim 3, wherein forming the cathode terminal comprises forming a second ohmic-contact region including one or more carbon-rich layers on the back side of the substrate by generating a second laser beam towards the back side of the substrate, heating of the substrate to temperatures in the range of 1500° C. and 2600° C.

8. The method according to claim 7, wherein generating the second laser beam includes:
 utilizing a wavelength in the range of 290 nm and 370 nm;
 utilizing a pulse duration in the range of 100 and 300 ns; and
 utilizing an energy density in the range of 3 and 4.5 J/cm$^2$.

9. A method, comprising:
 forming a UV detector device that includes a silicon carbide (SiC) substrate having a first conductivity and a first concentration of dopant species, with a front side and a back side opposite to one another;
 forming a SiC drift layer on the front side of the substrate, the SiC drift layer having the first conductivity and a second concentration of dopant species lower than the first concentration;
 forming an anode terminal in the SiC drift layer, wherein forming the anode terminal includes:
  forming a doped anode region in the drift layer, including dopant species having a second conductivity opposite to the first conductivity; and
  forming a first ohmic-contact region including one or more carbon-rich layers in the doped anode region.

10. The method according to claim 9, comprising forming the one or more carbon-rich layers exclusively within the doped anode region.

11. The method according to claim 9, comprising forming a cathode terminal that includes a second ohmic-contact region including one or more carbon-rich layers, extending in the doped anode region.

12. A method, comprising:
forming a UV radiation detector device by:
forming on a first side of a silicon carbide (SiC) substrate a drift layer having a first conductivity and a first concentration of dopant species, the SiC substrate has the first conductivity a second concentration of dopant species greater than the first concentration;
forming, in the drift layer, an anode terminal of the detector device, the forming the anode terminal includes:
forming a doped anode region, in the drift layer, dopant species having a second conductivity opposite to the first conductivity; and
forming a first ohmic-contact region including a carbon-rich layer in the doped anode region with a laser.

13. The method of claim 12, wherein the drift layer is silicon carbide.

14. The method of claim 12, wherein the doped anode region extends in depth in the drift layer starting from a top surface of the drift layer and the first ohmic-contact region has a top surface coinciding with the top surface of the drift layer.

15. The method of claim 12, wherein forming the first ohmic-contact region includes heating the doped anode region to temperatures in the range of 1500° C. and 2600° C. by generating a first laser beam to the doped anode region and causing activation of the dopant species having the second conductivity of the doped anode region.

16. The method of claim 15, wherein generating the first laser beam includes:
utilizing a wavelength in the range of 290 nm and 370 nm;
utilizing a pulse duration in the range of 100 and 300 ns; and
utilizing an energy density in the range of 1.5 and 4.5 J/cm$^2$.

17. The method of claim 12, wherein forming the first ohmic-contact region comprises forming the carbon-rich layer exclusively within the doped anode region.

18. The method of claim 12, wherein the first ohmic-contact region extends in the doped anode region for a depth in the range of 1 nm and 20 nm.

* * * * *